United States Patent [19]
Oldfield et al.

[11] Patent Number: 5,825,669
[45] Date of Patent: Oct. 20, 1998

[54] METHOD OF UPDATING AUTOMATIC CALIBRATION TO PROVIDE A PERCEIVED PERFECT THROUGH CONNECTION

[75] Inventors: William W. Oldfield, Redwood City; Edward Daw, Hollister, both of Calif.

[73] Assignee: Wiltron Company, Morgan Hill, Calif.

[21] Appl. No.: 767,716

[22] Filed: Dec. 17, 1996

[51] Int. Cl.⁶ .................................................. G01R 27/00
[52] U.S. Cl. .............. 364/521.01; 354/485; 354/521.04; 354/487; 324/601; 324/638
[58] Field of Search ................... 364/571.01, 571.04, 364/571.02, 484–487, 571.07; 324/601, 612, 638, 637, 650, 613, 630, 615

[56] References Cited

U.S. PATENT DOCUMENTS

| | | | |
|---|---|---|---|
| 5,191,294 | 3/1993 | Grace et al. | 324/613 |
| 5,307,284 | 4/1994 | Brunfeldt et al. | 364/485 |
| 5,313,166 | 5/1994 | Eul et al. | 324/601 |
| 5,434,511 | 7/1995 | Adamian et al. | 324/601 |
| 5,467,021 | 11/1995 | Adamian et al. | 324/601 |
| 5,552,714 | 9/1996 | Adamian et al. | 324/601 |
| 5,578,932 | 11/1996 | Adamian | 324/601 |
| 5,587,934 | 12/1996 | Oldfield et al. | 364/571.01 |

*Primary Examiner*—James P. Trammell
*Assistant Examiner*—Bryan Bui
*Attorney, Agent, or Firm*—Fliesler, Dubb, Meyer & Lovejoy

[57] ABSTRACT

A method for updating automatic calibration to provide a perfect through connection during the calibration of the VNA. After the VNA is initially calibrated, a user may assess the calibration of the through connection to determine if the quality is sufficient. If the quality is insufficient, the user is able to replace the calibration parameters for the through connection used during initial calibration with parameters for a currently used through connection to create a perceived "perfect" through connection calibration.

5 Claims, 3 Drawing Sheets

METHOD OF UPDATING AUTOMATIC CALIBRATION TO PROVIDE A PERCEIVED PERFECT THROUGH CONNECTION

BACKGROUND OF THE INVENTION

1. Field of the Invention

The present invention relates to the calibration of vector network analyzers ("VNAs") in general, and in particular to a method of providing a perceived "perfect" through connection after calibration.

2. Description of the Related Art

VNAs measure complex transmission and reflection characteristics of microwave devices as a function of frequency. The VNA compares the signal incident to a device under test ("DUT") with the signal transmitted through or reflected from the DUT. A scattering matrix that characterizes the DUT is derived by ratioing these signals. The four S parameters contained in this scattering matrix include input reflection (S11), forward transmission (S21), output reflection (S22) and reverse transmission (S12).

There are errors in measuring S parameters for a DUT due to imperfections in the VNA such as mismatches in couplers at test ports and the like. To correct for these errors, VNAs are typically calibrated to increase measurement accuracy. The calibration consists of connecting known microwave standards to the test ports of the VNA and having the VNA measure the standards. Then using a computer controlled "vector correction", the system "error coefficients" are calculated and added to the values measured by the VNA. The result is that the accuracy of the "known" standards is transferred to the VNA. Historically, "known" standards meant that the standards were as close to "perfect" as possible. Typical standards are opens, shorts, terminations, and through standards. These standards were manufactured to exacting tolerances and the quality of the calibration was directly related to the quality of the standards.

Recently, it was recognized that "known" could be mean pre-measured and that the standards did not have to be "perfect" as long as the computer was informed of the true S parameters of the imperfect standard. In U.S. patent application, Ser. No. 08/140,781, entitled "Automatic VNA Calibration Apparatus", by Oldfield et al., filed Oct. 21, 1993 (hereinafter "Oldfield"), incorporated herein by reference, a device is described for providing automatically controlled switches to connect calibration standards to a VNA for calibration measurements.

As described in Oldfield, automatic calibration of a VNA consists of connecting a box containing automatically switched standards to the test ports of the VNA and informing the controlling computer within the VNA of the S parameters of each standard. The box is pre-measured by a calibrated VNA and these "known" S parameters become the calibration standards.

A problem with automatic calibration is that, after the VNA is calibrated and the test ports are connected directly without the box, the resulting through connection does not look as "perfect" on the VNA display as when calibration is performed using a non-automatic calibration. "Perfect" in this case would be perfectly flat transmission measurements S21 and S12 with frequency and infinite return loss for the reflection parameters S11 and S22. The reason for this imperfection is that the direct through characteristics are derived during auto-calibration and any calibration errors are displayed. This contrasts to a standard calibration where a direct through connection is a part of the calibration process and the through line is one of the standards. Thus, during a standard calibration, a direct through measures the defined standard and appears "perfect" even if the actual calibration is poor.

Thus, a poor calibration using a non-automatic method will have a "perfect" looking through connection and an automatic calibration with a very good calibration will not look as "perfect." This creates a problem of perception as well as an actual measurement problem.

The perception problem is that a person accustomed to using a standard VNA calibration is used to seeing a perfect through connection after calibration, even if the calibration is poor. Viewing a non-perfect through connection, however minimally imperfect, will not impart confidence in the quality of the calibration.

The actual measurement problem is that all S21 and S12 measurements are referenced from the through connection standard used during calibration and any other through connection will not show perfect results, especially for small values of insertion loss. The problem increases with time because temperature variations and system variations cause the direct through performance to degrade. In particular, the low insertion loss measurement accuracy is highly degraded.

A need therefore exists to alleviate the perceived problem of not having a "perfect" through connection standard when an automatic calibration is used.

SUMMARY OF THE INVENTION

A method for updating automatic calibration to provide a perfect through connection during the calibration of the VNA. In the method, after the VNA is initially calibrated, a user may assess the calibration of the through connection to determine if the quality is sufficient. If the quality is insufficient, the user is able to replace the calibration parameters for the through connection used during initial calibration with parameters for a currently used through connection to create a perceived "perfect" through connection calibration.

BRIEF DESCRIPTION OF THE DRAWINGS

The above and other aspects, features and advantages of the present invention will become apparent from the following accompanying figures and detailed description of the method of updating the imperfect through connection parameters according to the present invention.

DETAILED DESCRIPTION OF THE INVENTION

Figure 1:
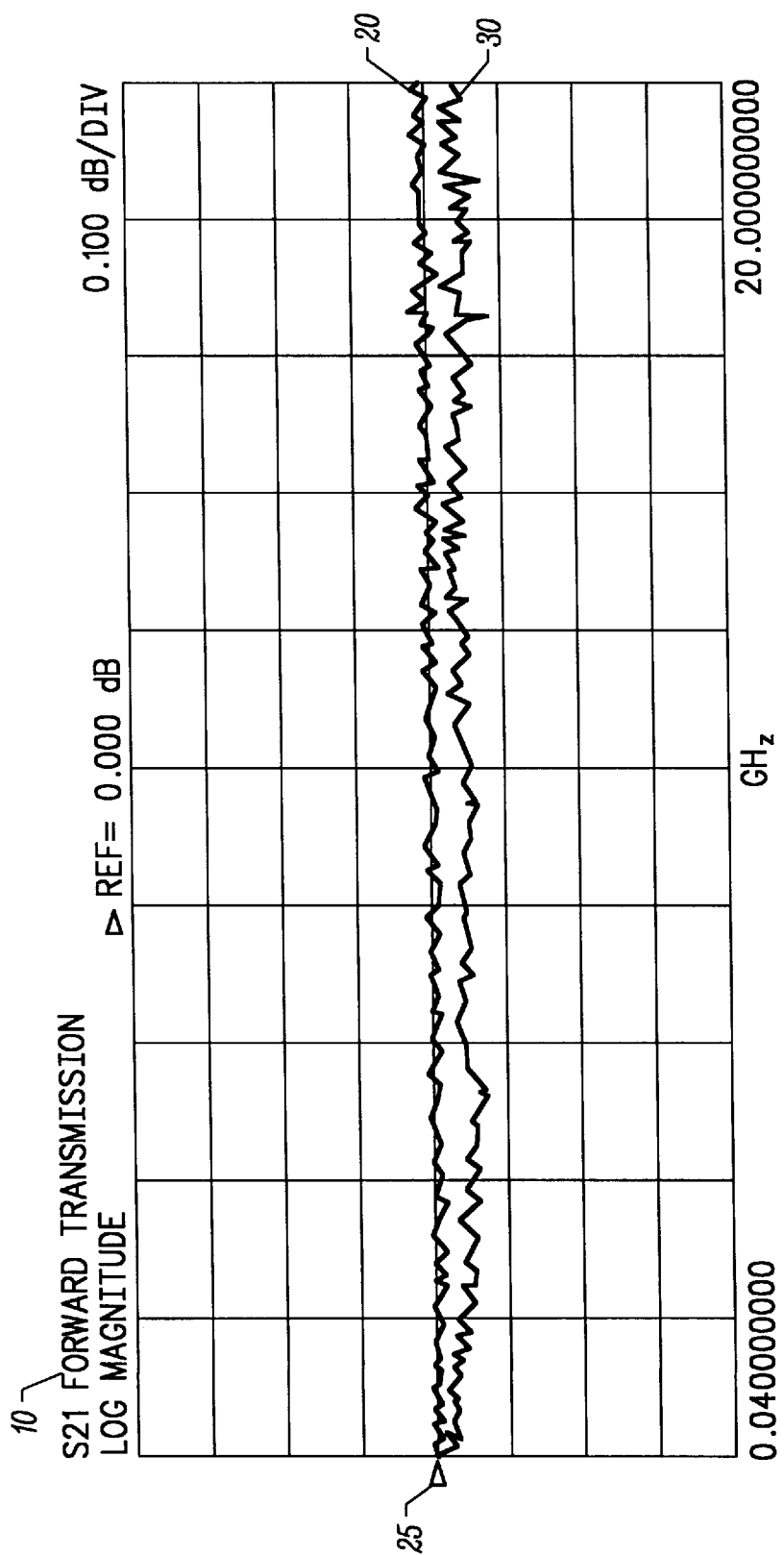
FIG. 1 is a transmission plot of the S21 forward transmission parameter using a standard and automatic calibration.

FIG. 1 illustrates the S21 forward transmission plot generally referenced as 10. The forward transmission plot 10 displays the result of through connections, using both a standard calibration and an automatic calibration. The standard calibration through connection is depicted by line 20. The standard line 20 ideally is a straight line at reference 25 and as such is considered a "perfect" through connection calibration by a user.

An automatic calibration line 30 is a result of an automatic calibration of the VNA. The automatic calibration of the VNA consists of connecting a box containing standards which are automatically connected to the test ports of the VNA and informing the controlling computer of the S parameters of each standard. The box automatically switches to through, short, open and load standards contained within the box during calibration. Standards in the box are premeasured by a calibrated VNA and these "known" S parameters are used for informing subsequent VNA during subsequent calibrations. As is clear from FIG. 1, the two lines 20 and 30 are not similar and the ideal line 20 is closer to "perfect" because calibration was performed using a standard calibration method.

Figure 2:
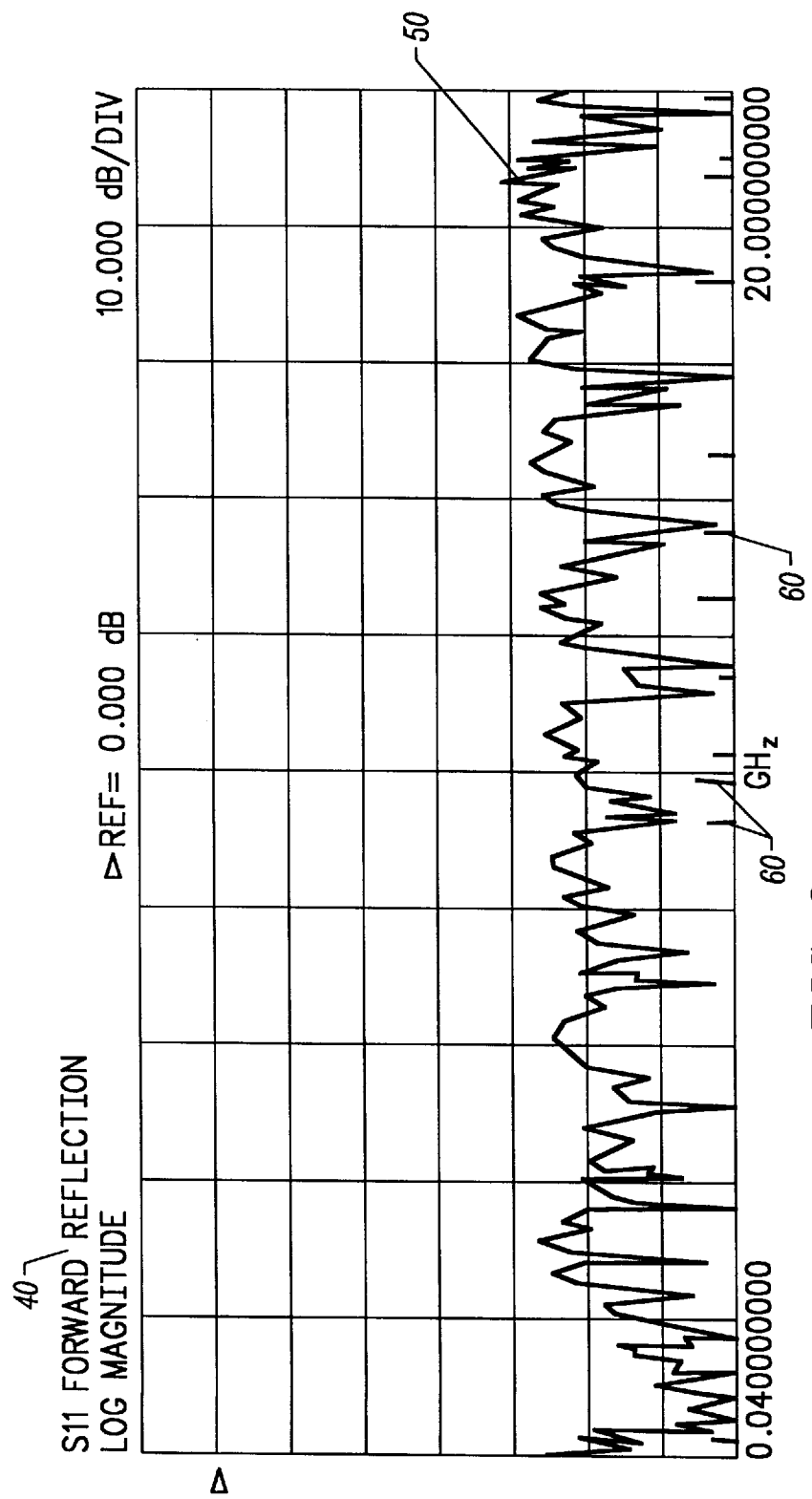
FIG. 2 is a transmission plot of the S11 forward reflection parameter after an automatic and standard calibration.

FIG. 2 generally shows a S11 forward reflection plot 40. Under an ideal or "perfect" calibration, no response should be shown on this forward reflection plot 40. However, as seen by the measurement 50 of an automatic direct through connection, there exists a "imperfect" through connection. The plot 40 also shows a response 60 for a through line with a standard calibration, however, these spikes are more than 60 dbs below the reference.

Plots similar to those in FIGS. 1 and 2 are typically displayed by a user after a calibration, whether automatic or standard, for the user to assess the quality of the calibration.

Figure 3:
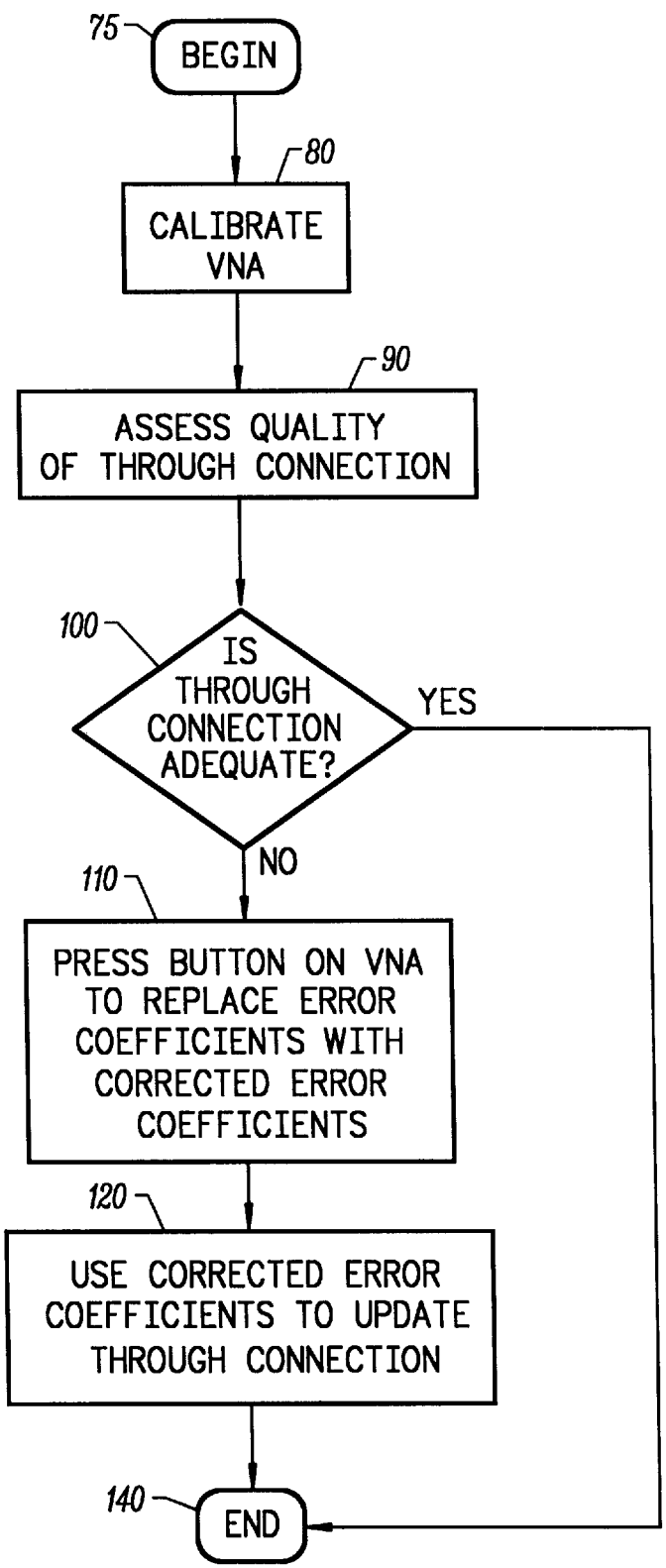
FIG. 3 illustrates a flow chart detailing the method of the present invention.

FIG. 3 illustrates a flow chart of the methodology of the present invention. A user begins 75 the calibration update by calibrating the VNA at step 80. After such initial calibration, a user is able to assess at 90 the quality of the through connection calibration. Such an assessment would include the review of plots such as forward transmission plot 10 and the forward reflection plot 40 of FIGS. 1 and 2, respectively. If the user determines that the through connection is not adequate at step 100, the user may press a button at 110 on the VNA to recalculate and replace initial calibration coefficients with new calibration values using measured values for the current through connection. The replacement is done using any conventional method for storing calibration values. On the other hand, if the through connection is considered adequate at 100, then the user skips steps 110 and 120 and ends 140 the procedure.

Although the invention is described for use with automatic calibration, it is also useful when a standard calibration is utilized. As indicated previously, a calibration will degrade with time due to factors such as changing temperature. Thus after a period of time, a through connection may not look as perfect as it did initially after calibration. The present invention, thus, enables a user to correct a through connection during a period of time after calibration and depress a button to remeasure the through connection and recalculate and replace the calibration with the measured values for the through connection. After such replacement, the through line will appear "perfect."

Although the invention has been described with particularity, this was merely to teach one of ordinary skill in the art how to make and use the invention. Many modifications will fall within the scope of the invention, as that scope is defined by the following claims.

What is claimed is:

1. A method of updating initial calibration parameters for a VNA comprising the steps of:

coupling first calibration components to test ports of the VNA, the first calibration components including a first through connection;

measuring first scattering parameters after coupling each of the first calibration components to the test ports of the VNA;

comparing the first measured scattering parameters with second scattering parameters previously measured and stored to determine the initial calibration values which can be utilized to correct errors introduced by the VNA;

connecting a second through connection to the test ports of the VNA;

measuring third scattering parameters for the second through connection; and recalculating the initial calibration parameters utilizing the third measured scattering parameters for the second through connection to provide updated calibration parameters.

2. The method of claim 1 wherein said initial calibration is provided using an automatic calibration apparatus containing the first calibration components along with terminals for connecting to test ports of the VNA and switches for selectively connecting individual ones of the first calibration components to the terminals of the automatic calibration apparatus.

3. The method of claim 2 wherein the calibration components comprise the first through connection along with, a short, an open and a load.

4. The method of claim 3 wherein said updated calibration parameters are recalculated by utilizing the first scattering parameter measurements from said short, open and load along with the third scattering parameter measurements from said second through connection.

5. The method of claim 1 wherein said recalculating step filter comprises:

depressing a button located on the VNA to remove the initial calibration parameters; and storing the updated calibration parameters.

* * * * *